United States Patent [19]
Norris

[11] Patent Number: 4,600,932
[45] Date of Patent: Jul. 15, 1986

[54] ENHANCED MOBILITY BURIED CHANNEL TRANSISTOR STRUCTURE

[75] Inventor: Peter E. Norris, Cambridge, Mass.

[73] Assignee: GTE Laboratories Incorporated, Waltham, Mass.

[21] Appl. No.: 660,175

[22] Filed: Oct. 12, 1984

[51] Int. Cl.$^4$ .............................................. H01L 29/80
[52] U.S. Cl. ....................... 357/22; 357/16; 357/61
[58] Field of Search ............... 357/22 MD, 22 P, 16, 357/61; 148/DIG. 67

[56] References Cited

FOREIGN PATENT DOCUMENTS 0056904 8/1982 European Pat. Off. ...... 357/22 MD
0064370 10/1982 European Pat. Off. ...... 357/22 MD

OTHER PUBLICATIONS

Lee et al., "High Temperature Annealing of Modulation Doped GaAs/AlGaAs Heterostructures for FET Applications", Proceedings IEEE/Cornell Conference on High-Speed Semiconductor Devices & Circuits, Aug. 1983, pp. 204–208.

Primary Examiner—Andrew J. James
Assistant Examiner—R. Limanek
Attorney, Agent, or Firm—Fred Fisher

[57] ABSTRACT

An enhanced mobility buried channel transistor structure in which the quasi-two-dimensional electron gas (2DEG) which forms the conducting channel in the structure is removed from the proximity of the heterointerface, and is placed in a region remote therefrom. A "tapered" layer of $Al_xGa_{1-x}As$ is provided, where x varies from maximum to minimum as the interface with an undoped layer of GaAs is approached.

5 Claims, 5 Drawing Figures

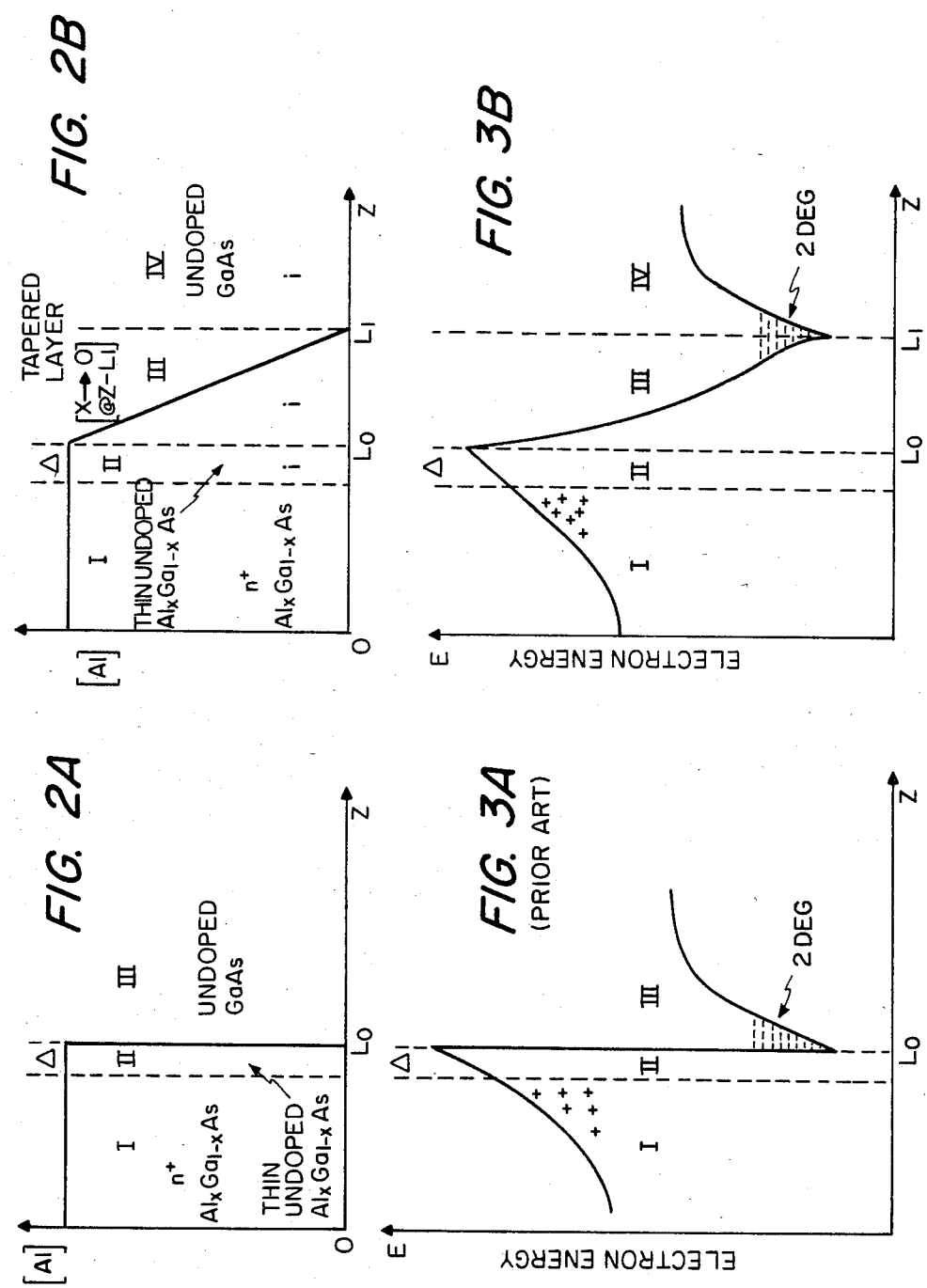

ENHANCED MOBILITY BURIED CHANNEL TRANSISTOR STRUCTURE

BACKGROUND OF THE INVENTION

1. Field of the Invention

This invention relates to enhanced, mobility buried channel transistor structures. Accordingly, it is a general object of this invention to provide new and improved structures of such character.

2. General Background

Enhanced mobility devices using $Al_xGa_{1-x}As$/GaAs materials systems have been reported upon by others and their potential use as high-speed active devices have been recognized. For example, Mimura et al., in an article entitled "A New Field-Effect Transistor with Selectively Doped GaAs/n-$Al_xGa_{1-x}As$ Heterojunctions", Japanese Journal of Applied Physics, Vol. 19, No. 5, May, 1980, pp. 1225-1227, describe studies of field-effect control of high mobility electrons in MBE (molecular beam epitaxy)grown selectively doped GaAs/n-$Al_xGa_{1-x}As$ heterojunctions. A fabrication of a field-effect transistor, termed a high electron mobility transistor (HEMT), with extremely high speed microwave capabilities is reported therein. As reported, in heterostructure junctions, including alternate layers of GaAs and $Al_xGa_{1-x}As$, with $Al_xGa_{1-x}As$ layers being selectively doped with silicon, due to higher electron affinity of GaAs, free electrons in the $Al_xGa_{1-x}As$ layers are transferred to the non-doped GaAs layers where they form a quasi two-dimensional Fermi gas. The mobility enhancement behavior is attributed to the spatial separation between the electrons and their parent donor impurities.

Hiyamizu et al. published a paper entitled "MBE-Grown GaAs/N-AlGaAs Heterojunctions and Their Application to High Electron Mobility Transistors" in Proceedings of the 13th Conference on Solid State Devices, Tokyo, 1981, Japanese Journal of Applied Physics, Vol. 21 (1982) Supplement 21-1, pp. 161-168. They noted that selectively doped GaAs/N-AlGaAs heterostructures grown by MBE have attracted much interest because of their potential for application to high speed devices since the quasi two-dimensional electron gas (2DEG) accumulating at the heterojunction interface shows extremely high mobility, especially at low temperatures. In their paper, they describe heterostructures which show high 2DEG mobilities for such heterostructure materials, and fabrication of high speed devices.

The following is a brief review of enhanced mobility transistor operation:

A basic enhanced mobility transistor structure includes a semi-insulating substrate formed of group III-V material; a preferred form, as discussed hereinafter, would include gallium arsenide. As indicated above, gallium arsenide is a semi-insulator.

In order to provide a clear description of a semiinsulator, it is noted that semiconductors are a broad class of materials which have a moderate bandgap, inbetween that of conductors and insulators. Through doping, or through the addition or introduction of impurities to various semiconductors, material can be produced that is either semi-insulating, heavily conducting, or moderately conducting. Thus, the electrical conduction properties of a semiconductor can be tailored to desired specifications by the addition of an appropriate dopant or dopants. In the instant situation, the semi-insulating gallium arsenide substrate, referred to hereinabove, is one which has no intentional conducting dopant added thereto. The semi-insulating gallium arsenide substrate behaves as if it were an insulator, for all practical purposes, and as a means for isolating various electrical circuits from one another.

The basic enhanced mobility transistor structure includes a semi-insulating gallium arsenide substrate with a thin layer of undoped gallium arsenide epitaxially deposited thereon. It further includes a heavily doped n type $Al_xGa_{1-x}As$ layer which acts as a carrier source and a thin (50-100 angstroms, for example) layer of undoped $Al_xGa_{1-x}As$ between the heavily n doped carrier layer and the GaAs epitaxial layer immediately below.

An enhanced mobility transistor device operates on a principle of modulation doping. Modulation doping occurs when a heavily doped wide bandgap material is placed adjacent to a non-intentionally doped narrow bandgap substance. The operating principle of an enhanced mobility device is dependent upon a conducting sheet of charge in the form of a quasi two-dimensional electron gas (2DEG) which is located at the interface between the narrow bandgap material and the wide bandgap material.

Carriers diffuse from the heavily doped $Al_xGa_{1-x}As$ layer into the undoped GaAs layer forming a sheet of negative charge (2DEG) at the $Al_xGa_{1-x}As$/GaAs interface. The 2DEG then acts as a channel, or conducting path, from source to drain (as in a depletion mode field effect transistor) under control of the gate depletion region. Reverse biasing the gate with a sufficiently negative potential interrupts the sheet of negative charge resulting in channel pinchoff, turning off the transistor. The presence of the quasi 2-dimensional electron gas in the nominally undoped GaAs results in reduced ionized impurity scattering and the phenomenon of "enhanced" mobility, i.e., a much large $\mu_e$ than for GaAs doped to an equivalent carrier concentration.

The magnitude of mobility enhancement is reduced by long range coulomb interaction with the ionized impurities and interface scattering. Coulomb interaction is the force exerted between charged bodies. Interface scattering is the mechanism by which carriers moving through a semiconductor are interfered by the discontinuity that the interface represents.

SUMMARY OF THE INVENTION

It is another object of this invention to provide a new and improved enhanced mobility, buried channel, transistor structure that minimizes long range coulomb interaction with the ionized impurities and interface scattering by removing the channel from the immediate vicinity of the $Al_xGa_{1-x}As$/GaAs interface.

Still another object of this invention is to provide a new and improved enhanced mobility, buried channel, transistor structure by removing the conducting channel from the immediate proximity of the surface of the structure to thereby reduce interaction between the quasi 2-dimensional electron gas and the surface.

In accordance with one aspect of the invention, an enhanced mobility, buried channel, transistor structure includes a semi-insulating gallium arsenide substrate having a pair of opposed surfaces. An undoped layer of gallium arsenide is deposited upon one surface of the substrate. A first layer of undoped $Al_xGa_{1-x}As$ is deposited on the undoped layer of GaAs. The value of x varies through the first layer from a maximum value distant from the undoped layer to a minimum value proximal to the undoped layer. A second layer of undoped $Al_xGa_{1-x}As$ is deposited onto the first layer (the value of x for the second layer being a constant). A doped layer of $Al_xGa_{1-x}As$ is deposited onto the second layer, wherein the value of x for this doped layer is a constant. A source electrode is deposited onto the doped layer, and a drain electrode is deposited onto the doped layer. A gate electrode is deposited onto the doped layer between the source electrode and the drain electrode.

In accordance with certain specific features of the invention, the constants and the maximum value are equal to each other, the foregoing minimum is zero, and the value of x for the first layer uniformly varies with distance from the undoped layer of gallium arsenide. The maximum value and the constants can be equal. The thickness of the doped layer can be on the order of 250 to 1000 angstroms. The thickness of the second layer can be on the order of 0 to 100 angstroms, and the thickness of the first layer can be on the order of 100 to 200 angstroms.

In accordance with another aspect of the invention, an enhanced mobility, buried channel transistor structure can include a semi-insulated substrate formed of a III-V ternary and quaternary semiconducting compound having a pair of opposed surfaces. An undoped layer of the compound is deposited upon one surface of the substrate. A first layer of an undoped compound formed of the III-V ternary or quaternary compound with a variable proportion of an element from Group III or Group V of the Periodic Table is deposited on the undoped layer, the proportion of the element varying through the first layer from a maximum value distant from the undoped layer to a minimum proximal to the undoped layer. A second layer of an undoped compound formed of the III-V ternary or quaternary compound and the maximum proportion of the element is deposited on the first layer. A doped layer of the last named compound formed of the III-V ternary or quaternary compound and the maximum proportion of the element is deposited onto the second layer. A source electrode is deposited onto the doped layer. A drain electrode is deposited onto the doped layer. A gate electrode is deposited onto the doped layer between the source electrode and the drain electrode.

BRIEF DESCRIPTION OF THE DRAWINGS

Other objects, advantages and features of this invention, together with its construction and mode of operation, will become more apparent from the following description, when read in conjunction with the accompanying drawing, in which:

FIG. 2A is a chart illustrating the proportion of aluminum in the material versus the distance through the transistor structure for an enhanced mobility transistor of the prior art;

FIG. 2B is a chart illustrating the proportion of aluminum in the material versus the distance through the transistor structure for an enhanced mobility, buried channel transistor structure having a tapered layer in accordance with one embodiment of the invention;

FIG. 3A is a chart of electron energy versus distance throughout an enhanced mobility transistor of the prior art; and FIG. 3B is a chart of electron energy versus distance throughout an enhanced mobility, buried channel transistor structure in accordance with a preferred embodiment of the invention.

DETAILED DESCRIPTION

Figure 1:
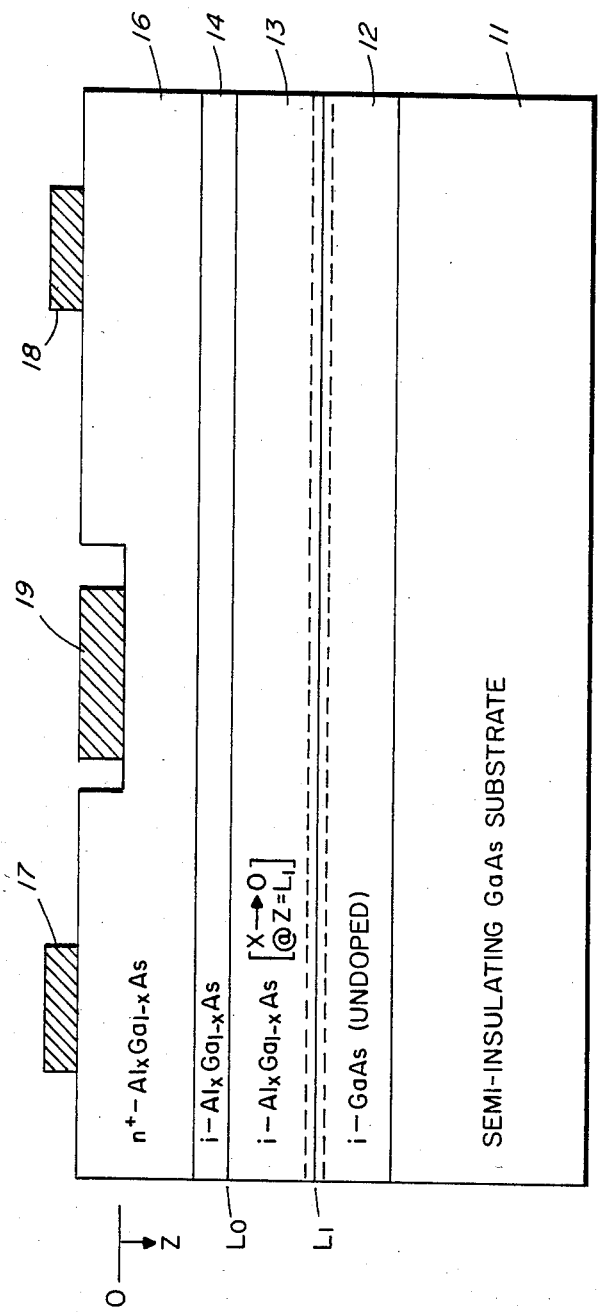
FIG. 1 is a cross-sectional view of an enhanced mobility, buried channel transistor structure in accordance with one embodiment of the invention.

Referring to FIG. 1, there is depicted a crosssectional diagram of an enhanced mobility, buried channel transistor structure (EMBCT) in accordance with a preferred embodiment of the invention. As depicted therein, there is shown a semi-insulating gallium arsenide substrate 11 which acts as a quasi insulating support for the various epitaxial layers to be deposited thereupon. An undoped layer 12 of gallium arsenide is epitaxially deposited upon the semi-insulating gallium arsenide substrate 11.

A layer 13 of $Al_xGa_{1-x}As$ is deposited upon the undoped layer 12 of gallium arsenide. The value of x for the layer 13 of $Al_xGa_{1-x}As$ varies from a maximum quantity distant from the layer 12 of gallium arsenide to a minimum quantity (preferably zero) as the layers 13, 12 are in contact with one another. The value of x desirably varies in a uniform manner, and, in a preferred mode, the thickness of the $Al_xGa_{1-x}As$ layer 13 is in the order of 100 angstroms.

Another layer 14 of undoped $Al_xGa_{1-x}As$ (wherein the value of x is the maximum and constant) is deposited upon the tapered layer 13. Desirably, the various layers are epitaxially grown upon the substrate 11. A top layer 16 of n+ doped $Al_xGa_{1-x}As$ is deposited upon the constant undoped $Al_xGa_{1-x}As$ layer 14.

A source electrode 17 is placed upon the doped layer 16. Likewise, a drain electrode 18 is placed upon the doped layer 16. A gate electrode 19 is deposited upon the doped layer 16 between the source electrode 17 and the drain electrode 18. The electrodes 17, 19 and 18, respectively, can be deposited upon a doped layer 16 in accordance with techniques well known in the art through the use of Au/Ge and Ti/W contacts, respectively, for example.

Referring to FIG. 1, assuming the interface of the contact 19 with the doped layer 16 as being at a distant $Z=0$, and the value of Z increases inwardly, Z reaches a level of $L_0$ where the layers 14 and 13 abut each other, and reaches a value of $L_1$ where the layers 13 and 12 abut each other. The amount, or proportion, of aluminum to be found in the structure is illustrated in FIG. 2B, wherein the proportion of aluminum in the layers 16 and 14 are a constant value of x, as is apparent from FIG. 2B, dropping uniformly downward to zero at the interface of the layers 13 and 12. As depicted in FIG. 3B, the electrons tend to group at the interface of the layers 13 and 12.

The composition profile of the transistor structure hence has been modified to move the potential energy minimum away from layer 16. This has been achieved through the use of a graded or tapered $Al_xGa_{1-x}As$ layer 13 where the aluminum concentration x is a function of the distance into the structure, as shown in FIGS. 1, 2B and 3B.

As is evident from FIGS. 2A, 2B and 3A, 3B, the enhanced mobility, buried channel transistor structure has its conducting channel located a distance $(L_1-L_0)$ away from the metallurgical interface of the layers 13, 14 at $L_0$ with the result that both coulomb interaction and interface scattering are reduced, thus resulting in a larger mobility enhancement for an enhanced mobility buried channel transistor in accordance with this invention, over conventional enhanced mobility transistor structures.

The value of x represents the proportional amount of aluminum in the wide bandgap material, and typically would be in the range of 0.2–0.4.

A quasi 2-dimensional electron gas does not exist in the absence of an applied voltage for an enhancement mode device, but it does for a depletion mode device. Its existence depends upon the thickness of the heavily doped wide bandgap material and the doping level in that region.

A quasi 2-dimensional electron gas can exist without the application of external biases although, in the case of enhancement mode devices, an external bias is required. A depletion mode device would have a 2-dimensional electron gas without a bias, and in an enhancement mode device, the quasi 2-dimensional electron gas does not exist unless an external bias is applied.

Modifications can be formed without departing from the spirit and scope of this invention. For example, it is believed that this invention can be applicable to multiple well structures as well as single (quantum well) heterostructures.

What is claimed is:

1. An enhanced mobility buried channel transistor structure comprising
    a semi-insulating gallium arsenide substrate having a pair of opposed surfaces;
    an undoped layer of gallium arsenide deposited upon one of said surfaces of said substrate;
    a first layer of undoped $Al_xGa_{1-x}As$ deposited on said undoped layer of gallium arsenide, where the value of x varies through said first layer, from a maximum value distant from said undoped layer to a minimum proximal to said undoped layer;
    a second layer of undoped $Al_{x'}Ga_{1-x'}As$ deposited onto said first layer, where the value of x' for said second layer is a constant;
    a doped layer of $Al_{x''}Ga_{1-x''}As$ deposited onto said second layer, wherein the value of x'' for said doped layer is a constant;
    a source electrode deposited onto said doped layer;
    a drain electrode deposited onto said doped layer; and
    a gate electrode deposited onto said doped layer, between said source electrode and said drain electrode.

2. The structure as recited in claim 1 wherein said constants and said maximum value are equal to each other, wherein said minimum is zero, and wherein said value of x through said first layer uniformly varies with distance from said undoped layer of gallium arsenide.

3. The structure as recited in claim 1 wherein said maximum value and said constants are equal.

4. The structure as recited in claim 1 wherein the thickness of said doped layer is on the order of 250 to 1000 angstroms, the thickness of said second layer is on the order of 0 to 100 angstroms, and the thickness of said first layer is on the order of 100 to 200 angstroms.

5. An enhanced mobility buried channel transistor structure comprising
    a semi-insulating substrate formed of a III-V semiconducting compound, having a pair of opposed surfaces;
    an undoped layer of said compound deposited upon one of said surfaces of said substrate;
    a first layer of an undoped compound formed of said III-V compound and a variable proportion of an element from Group III of the Periodic Table deposited on said undoped layer, where the proportion of said element varies through said first layer, from a maximum value distant from said undoped layer to a minimum proximal to said undoped layer;
    a second layer of an undoped compound formed of III-V ternary or quaternary compound and said maximum proportion of said element, deposited on said first layer;
    a doped layer of said last named compound formed of said III-V ternary or quaternary compound and said maximum proportion of said element, deposited onto said second layer;
    a source electrode deposited onto said doped layer;
    a drain electrode deposited onto said doped layer; and
    a gate electrode deposited onto said doped layer, between said source electrode and said drain electrode.

* * * * *